United States Patent [19]

Nishizawa

[11] Patent Number: 4,604,262

[45] Date of Patent: Aug. 5, 1986

[54] APPARATUS FOR POSITIONING AND LOCATING A BAFFLE PLATE IN A CRUCIBLE

[75] Inventor: Minoru Nishizawa, Tokyo, Japan

[73] Assignee: Gakei Electric Works Co., Ltd., Tokyo, Japan

[21] Appl. No.: 675,410

[22] Filed: Nov. 27, 1984

[30] Foreign Application Priority Data

Aug. 31, 1984 [JP] Japan .............................. 59-182438

[51] Int. Cl.⁴ .............................................. B01D 9/00
[52] U.S. Cl. ............................ 422/310; 156/617 SP; 156/DIG. 98; 422/249; 310/90.5
[58] Field of Search ............................. 422/249, 310; 156/617 SP, DIG. 98; 308/10

[56] References Cited

U.S. PATENT DOCUMENTS

| | | | |
|---|---|---|---|
| 4,167,554 | 9/1979 | Fisher | 422/249 X |
| 4,284,605 | 8/1981 | Pierrat | 156/617 SP X |
| 4,310,492 | 1/1982 | Nakamishi et al. | 422/249 X |
| 4,497,777 | 2/1985 | Kojima | 422/249 |

FOREIGN PATENT DOCUMENTS

| | | | |
|---|---|---|---|
| 193943 | 12/1957 | Austria | 422/249 |
| 2362825 | 6/1975 | Fed. Rep. of Germany | 156/617.1 |

*Primary Examiner*—Robert Lindsay
*Attorney, Agent, or Firm*—Fleit, Jacobson, Cohn & Price

[57] ABSTRACT

In pulling a single crystal of a compound semiconductor having a high melting point and exhibiting a high dissociation pressure at such melting point, like a compound semiconductor of elements of Groups III-V such as GaAs or GaP, from a feed melt contained in a crucible and subject to an inert gas atmosphere of a high pressure, apparatus for positioning a baffle plate floating in the feed melt in a predetermined position in a stable state in order to prevent heat convection of the feed melt in the crucible from affecting the solid-melt interface and consequently a single crystal having a small dislocation density can be obtained.

11 Claims, 6 Drawing Figures

APPARATUS FOR POSITIONING AND LOCATING A BAFFLE PLATE IN A CRUCIBLE

BACKGROUND OF THE INVENTION

1. Field of the Invention

The present invention relates to an apparatus for positioning and locating a baffle plate which is floated in the interior of a crucible when pulling a single crystal.

2. Description of the Prior Art

In growing a single crystal of silicon (Si) or a compound semiconductor of Groups III–V, especially gallium arsenide (GaAs) or gallium phosphide (GaP), from a feed melt contained in a crucible, it is known to float a heat convection preventing baffle plate in the feed melt for preventing a natural heat convection occurring which causes a heat distortion.

It has been proposed in the art to float a baffle plate in a predetermined position below the surface of a feed melt solely by virtue of its buoyancy, but in such case the floating position is unstable and, as the level of the feed melt lowers with growth of a single crystal, holding the baffle plate in the appropriate predetermined position becomes difficult.

It has also been proposed in the art to fix a single control rod to a baffle plate to move and reposition the baffle plate as the liquid melt level lowers with cyrstal growth. In the case, however, for pulling of a single crystal, since the fixing position must be spaced from the center of the baffle plate, the baffle plate may be bent or inclined in use, and thus, a very unstable condition results.

On the other hand, when pulling single crystals of compound semiconductors of Groups III–V typified by GaAs and GaP melting as high as 1238° C. and 1470° C. and exhibiting dissociation pressures as high as about 1 atm and 30 atm, respectively, there has been developed a technique in which the upper surface of a feed melt is covered with a liquid sealing agent such as $B_2O_3$, and the interior of the furnace is placed under an inert gas atmosphere of an extremely high pressure of from several tens to several hundreds atm. In such circumstances, if the drive force transmitting means for a baffle plate control rod is sealed against the furnace pressure by a conventional sealing means using a mere sealing material, the sealing material will expand due to the high pressure in the furnace, thus making it impossible to effect a smooth transmission of the drive force and to maintain the furnace interior gas-tight completely.

Also, when using plural control rods, the baffle plate will be inclined or bent unless all the control rods are moved up and down at the same rate. Thus, the technical problem of how efficiently to design a control rod driving mechanism and how to mount same in a limited space so as not to obstruct other devices remains unsolved by the art and the need for a solution still exists.

Further, if one attempts to use a single crystal pulling shaft as the drive source for the baffle, the growth of the crystal will be badly influenced by any vibrations which may occur during transmission of the drive force and the risk is not worth what little may be accomplished. In short, there has to be a better way.

OBJECTS AND SUMMARY OF THE INVENTION

It is a primary object of the present invention to provide a baffle plate control apparatus whereby a baffle plate floated in a feed melt can be held in a predetermined position always in a stable state without being inclined or bent even as the melt level becomes lowered during pulling of and growth of a single crystal.

It is a secondary object of the present invention to provide a baffle plate control apparatus whereby, gastightness of the interior of a furnace held under an inert gas atmosphere of a high pressure can be maintained completely. Also, a single or plural baffle plate control rods can be moved smoothly at the same speed even under such adverse conditions.

It is a further object of the present invention to provide a baffle plate control apparatus capable of being mounted in a limited space efficiently without affecting at all the rotation of a single crystal pulling rod.

In the present invention, in order to attain the above-mentioned technical objects when pulling a single crystal, the control, positioning and location of a baffle plate floated in a predetermined position below the surface of a feed melt are accomplished by providing a plurality of control rods for holding the baffle plate in a desired predetermined position. The control rods are disposed in an opposed relation to each other with the single crystal pulling rod located between or among them. In one pattern, the control rods are positioned radially around the pulling rod, and a drive means is provided for moving the control rods axially at the same speed without interfering with the pulling rod.

According to the present invention, moreover, when pulling a single crystal in a furnace under an inert gas atmosphere of a high pressure while allowing a baffle plate to float in a predetermined position below the surface of a feed melt, there is provided a cylinder of a hermetically sealed structure which encloses therein a control rod for holding the baffle plate in the predetermined position. This cylinder is disposed on the side of the cylinder attached to the furnace which encloses therein the single crystal pulling rod. The control rod is moved up and down by a drive mechanism which interacts with and non-invasively drives the control rod hermetically sealed within its cylinder, such drive mechanism utilizing a magnetic force.

Further, where plural control rods are used, the individual cylinders which enclose these control rods are disposed in an opposed relation to each other with the cylinder enclosing the single crystal pulling rod and attached to the top of a furnace located between or among them. Alternatively, the individual cylinders may be radially spaced about the cylinder enclosing the pulling rod. Further, magnets of magnetic drive mechanisms for vertically moving the control rods can be located outside the individual cylinders and rotated simultaneously by means of a common gear mounted rotatably on the cylinder enclosing the single crystal pulling rod.

Under the construction described above, the baffle plate is stabilized by the provision of plural control rods, and whenever the furnace is operated with an inert gas atmosphere of a high pressure, the single or plural control rods can be moved smoothly without interfering with the high pressure furnace which can be maintained in a completely gas-tight condition. Also no vibrations are imparted to the single crystal pulling rod.

The above and other objects, features and advantages of the invention will become clear from the following description of the preferred embodiment taken in conjunction with the accompanying drawings.

DESCRIPTION OF THE PREFERRED EMBODIMENTS

Figure 1:
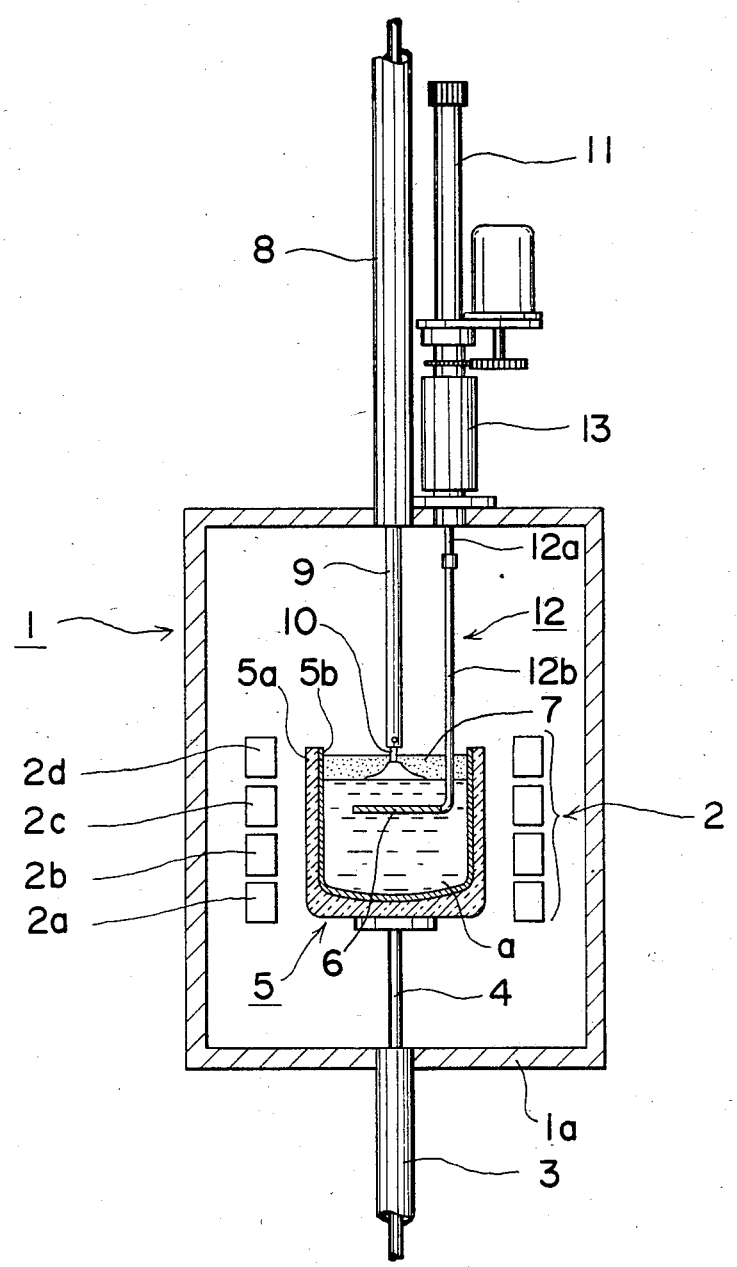
FIG. 1 is a schematic view illustrative of a first embodiment of the present invention.
Figure 2:
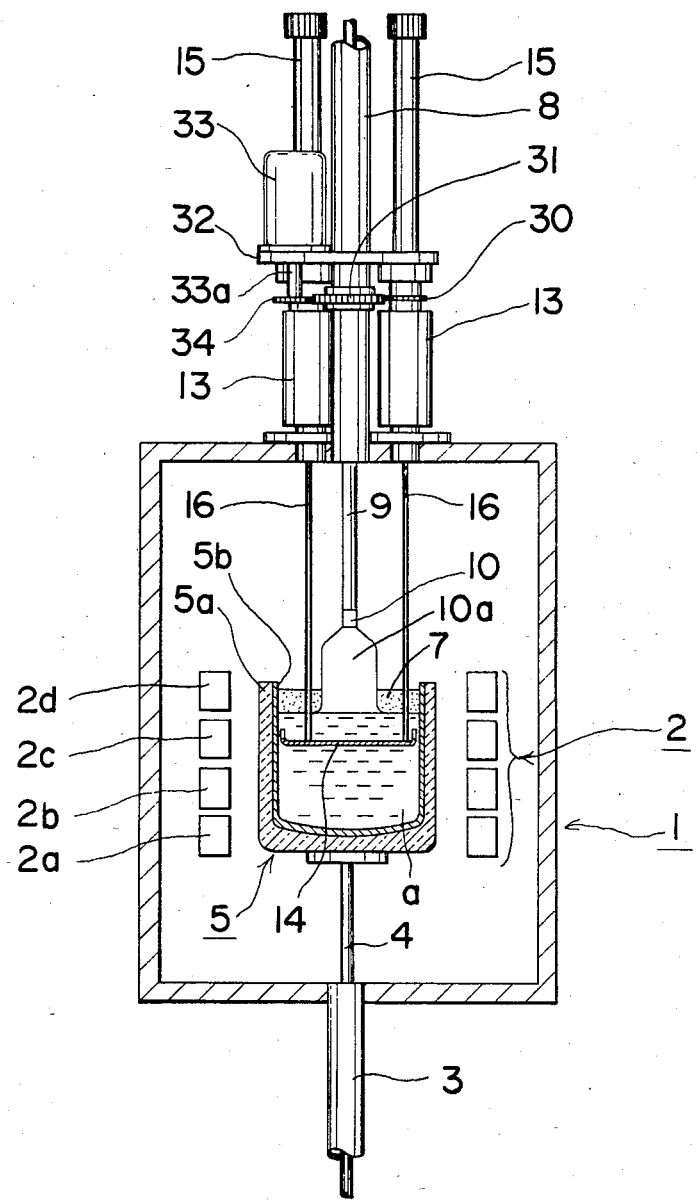
FIG. 2 is a schematic view illustrative of a second embodiment of the invention.
Figure 3:
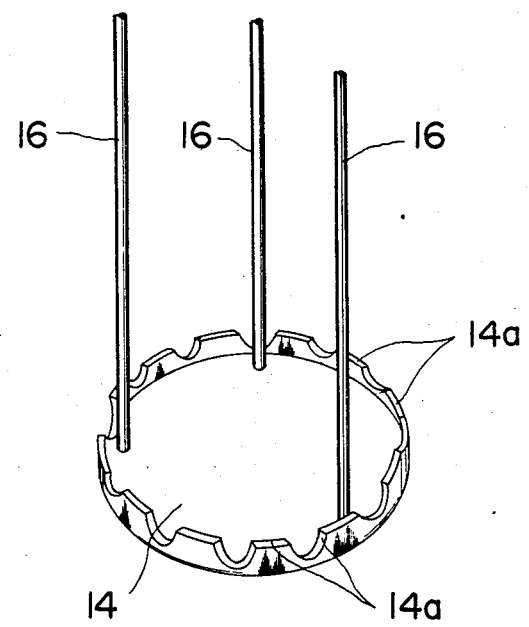
FIG. 3 is a perspective view showing an example of a baffle plate as shown in FIG. 2.
Figure 4:
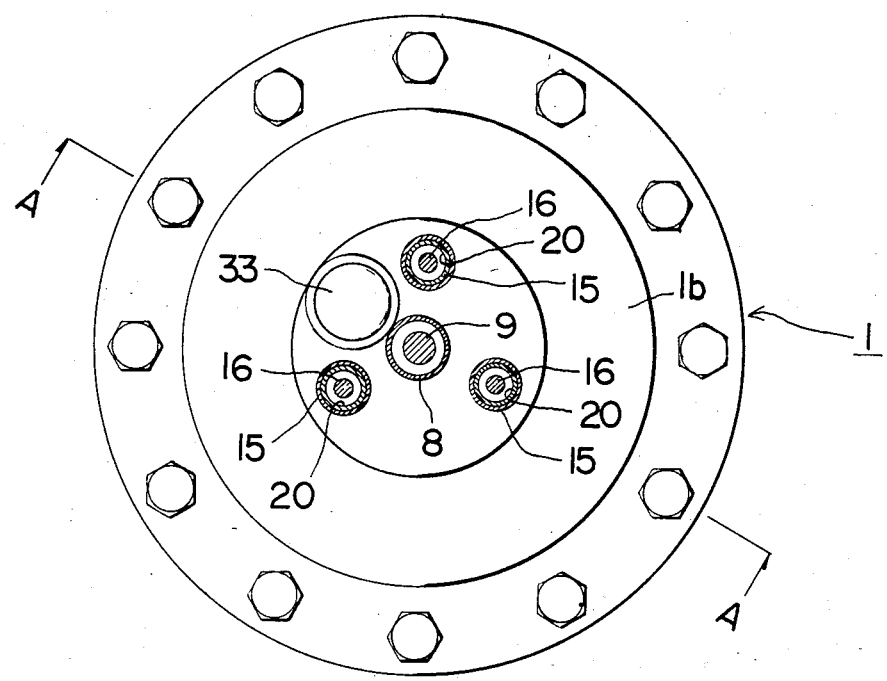
FIG. 4 is a plan view of a top cover portion as shown in FIG. 2.

Referring first to FIG. 1, there is illustrated a first embodiment of the invention, the reference numeral 1 denotes a heat- and pressure-resistant electric furnace formed of, for example, stainless steel, and the numeral 2 denotes an inductive heating means comprising, for example, axially quartered heaters 2a, 2b, 2c and 2d. From the central part of a bottom cover 1a of the electric furnace 1 is suspended gas-tightly a thin-walled lower tubular body 3 of a hermetically sealed structure having a small diameter, with a crucible supporting rod 4 being inserted through the lower tubular body 3 into the furnace 1. The crucible supporting rod 4 is vertically movable and rotatable by any suitable drive means (not shown) such as a magnetic drive means disposed inside and outside the lower tubular body 3, and on its upper end is fixed a crucible 5 which comprises an outer crucible 5a formed of, for example, graphite and an inner crucible 5b formed of, for example, quartz. In the crucible 5 is contained a feed melt "a", which is for example GaAs, in which is floated a baffle plate 6 having an outside diameter somewhat smaller than the inside diameter of the crucible 5. The upper surface of the feed melt is covered with a liquid sealing agent 7 such as, for example, $B_2O_3$.

On the central part of a top cover 1b of the electric furnace 1 is erected gas-tightly a thin-walled upper tubular body 8 of a hermetically sealed structure having a smaller diameter, and a single crystal pulling rod 9 is suspended through the interior of the upper tubular body 8 and inserted in the furnace 1, with a seed crystal 10 being attached to the lower or fore end of the rod 9. The single crystal pulling rod 9 is vertically moved and rotated by any suitable drive means (not shown) such as a magnetic drive means disposed inside and outside the upper tubular body 8.

As suitable magnetic drive means for rods 4 and 9, one may use the drives disclosed in my copending application filed even date hereof, Ser. No. 675,404, entitled "Crystal Pulling Apparatus for Making Single Crystals of Compound Semiconductors Containing a Volatile Component."

On the top cover 1b is erected a cylinder 11 in a position adjacent to the upper tubular body 8, but radially spaced therefrom. Suspended through the cylinder 11 into the furnace 1 is a control rod 12 which comprises a piston rod 12a formed of, for example, stainless steel and a pressing rod 12b formed of, for example, boron nitride (BN). The numeral 13 denotes an outside magnet as a constituent member of a magnetic drive mechanism as will be described later. To the lower or fore end of the control rod 12 is fixed the baffle plate 6 for preventing a heat convection in the feed melt "a", the baffle plate 6 occupying a predetermined position below the surface of the feed melt "a".

Referring now to FIGS. 2 to 6, there is illustrated a second embodiment of the invention, in which like parts to the description of FIG. 1 have been assigned the same reference numerals. As shown, three cylinders 15 are erected at equal intervals radially spaced about the cylinder 8 housing the crystal pulling rod 9. Three control rods 16 each comprised of a piston rod 16a formed of stainless steel and a pressing rod 16b formed of BN which rods 16a and 16b are axially coupled together. The three rods 16 are suspended through the cylinders 15 into the furnace 1, and their lower or fore ends press against and engage a baffle plate 14 having a scallop up-turned flange 14a on its circumference and the rods serve to hold the plate 14 in a predetermined position below the surface of the feed melt "a". The flange 14a is provided with cutouts with intermediate raised portions or ridges or fins.

Figure 5:
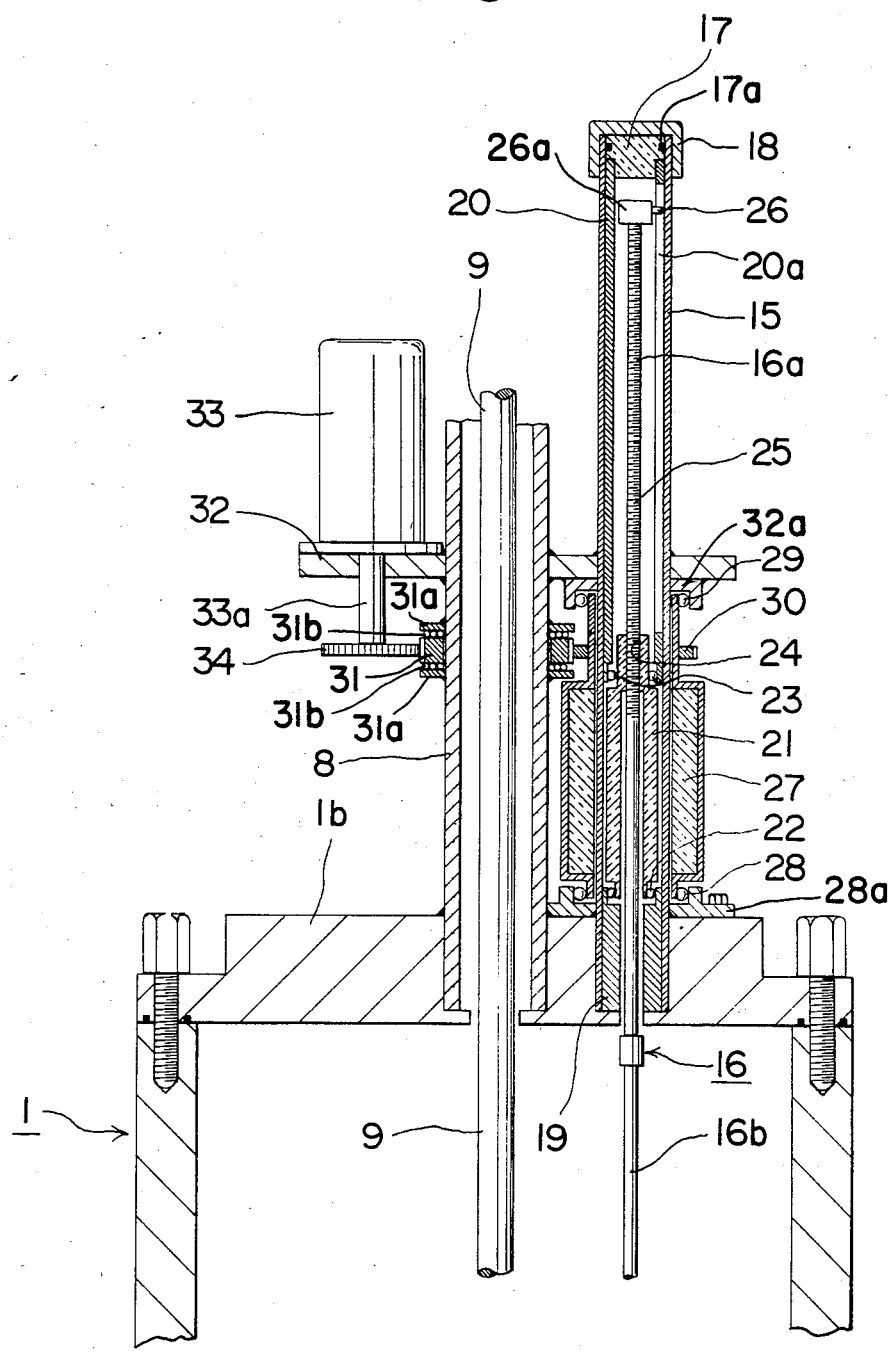
FIG. 5 is a sectional view taken on line A—A of FIG. 4.

The internal structure of one cylinder 15 will now be explained with reference to FIG. 5; all are the same. Cylinder 15 is hermetically sealed at its upper end by a plug 17 fitted into and over the end. A cover cap 18 threaded internally engages external threads on the upper end of cylinder 15. A packing 17a completes the hermetic seal. In a lower inside portion of the cylinder 15 is inserted a holding cylinder 19 which bears on a shoulder defined by cover 1b, and a relatively long suspending cylinder 20 having an axially extending guide slot 20(a) is suspended from plug 17. Between the holding cylinder 19 and the suspending cylinder 20 is mounted rotatably a cylindrical inside magnet 21 by means, for example, of ball bearing mechanisms 22 and 23. The inside magnet 21 has an internal thread portion 24 preferably formed as a separate element and attached to the body of magnet 21. An external thread portion 25 formed on the piston rod 16a of the control rod 16 extending through the inside magnet 21 and the suspending cylinder 20 engages thread portion 24. To the upper end of the piston rod 16a is attached a cap 26a which carries a sliding key 26 that engages with axial guide slot 20a formed in the suspending cylinder 20.

Figure 6:
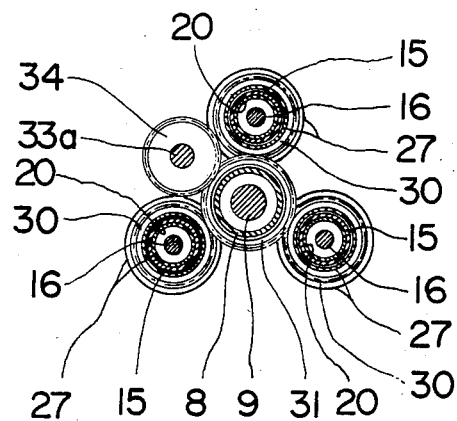
FIG. 6 is a schematic view illustrative of a control rod driving system as shown FIG. 2.

Outside the cylinder 15 and in alignment with the inside magnet 21 is located a cylindrical outside magnet 27 rotatably mounted through, for example, ball bearing mechanisms 28 and 29. A driven gear 30 is fixed to the outside magnet 27 and meshes with a main driving gear 31 which is bearing mounted rotatably on the outer periphery of the upper tubular body 8. In mesh with the main driving gear 31, as shown in FIG. 6, are driven gears 30, 30, 30 mounted on the outside magnets 27, 27, 27 disposed outside the three cylinders 15, 15, 15 with the control rods 16, 16, 16 enclosed therein. The main driving gear 31 also is in mesh with a driving gear 34 mounted on a driving shaft 33a of a drive motor 33 fixed to a base plate 32 which in turn is fixed (welded) to the upper tubular body (cylinder) 8 and cylinders 15. To the underneath side of plate 32 is fixed (welded) bearing plates 32a which mount ball bearings 29. Also bearing plates 28a, mounting ball bearings 28, are bolted to cover 1b. Gear 31 is bearing mounted to cylinder 8 by bearing plates 31a which are welded to cylinder 8 and mount ball bearings 31b.

In the above arrangement, for growing and pulling a single crystal, first a portion of polycrystalline GaAs is placed in a crucible 5, then the baffle plate 14 is put thereon, next the remainder of the polycrystalline GaAs is charged into the crucible, and finally a disc-like piece of $B_2O_3$ is placed thereon. Then, the crucible 5 is put inside heating means 2, and the interior of a furnace 1 is vacuum-evacuated. Thereafter, an inert gas is introduced into the furnace 1 to pressurize the furnace interior to 100 atm, and heaters 2a, 2b and 2c are raised in temperature to 1400° C. and heater 2d to a temperature 1200° C. As a result, first $B_2O_3$ melts and covers the upper surface of the polycrystalline GaAs. Then, the polycrystalline GaAs melts and the baffle plate 14 floats on the upper surface of the feed melt "a" which is ascribable to its specific gravity which feed melt is covered with $B_2O_3$ as a liquid sealing agent 7. After observing this state through a peep glass (not shown) or after confirming the melting with a temperature measuring means (not shown), such as described in my copending application filed even date herewith, Ser. No. 675,409, entitled "Single Crystal Growing Method and Apparatus," the drive motor 33 is operated, whereby its rotating driving force is transmitted via output shaft 31a to the driving gear 34, to the main driving gear 31 and further to the driven gears 30, so that the outside magnets 27 start rotating simultaneously and cause the rotation simultaneously of the inside magnets 21. Consequently, the threaded piston rods 16a of the moving rods 16 engaged with the internal thread portions 24 of rotating inside magnets 21 are translated axially downwardly, all at the same speed while being prevented from rotating by their respective sliding keys 26. Hence, the three pressing rods 16b enter into the crucible 5 and become immersed in the liquid sealing agent 7. When the rods 16b reach the baffle plate 14 through the liquid sealing agent 7 of $B_2O_3$ and press it levelly into the feed melt "a", the baffle plate 14 is brought gradually down to a predetermined position below the surface of the feed melt "a" without being inclined. The drive motor 33 is stopped to stop the baffle plate 14 in that predetermined position.

The descending distance is decided according to a preset program, and if the crucible 5 is rotated during the downward movement of the baffle plate 14, the descending motion will be effected more smoothly. After the baffle plate 14 is thoroughly contacted with the feed melt "a", a single crystal pulling operation is performed in a conventional manner by moving down the single crystal pulling rod 9 with its seed crystal 10 attached until seed crystal 10 contacts the feed melt whereupon it is slowly withdrawn to grow crystal 10a. As the melt level lowers with growth of the single crystal, the three control rods 16 are also brought down simultaneously to maintain the spacing between the baffle plate 14 and the surface of the feed melt "a" at a constant spacing during the single crystal pulling operation.

Although plural control rods 16 are used in the second embodiment, there may be used a single control rod 12 as shown in the first embodiment where the crucible 5 is of a large capacity and a sufficiently strong baffle plate 6 and rod 12 can be used. In the case where the baffle plate 6 is of a small diameter, about the same as the diameter of the single crystal to be pulled, a single control rod 12 may be used.

The invention has special utility when a high pressure gas atmosphere is present in the furnace interior. Even when a single control rod 12 is used, it can be moved smoothly without impairing the gas-tightness integrity of the system by means of the magnetic drive mechanism (as shown FIG. 5) disposed inside and outside the thin-walled cylinder 11 of a small diameter with the control rod 12 enclosed therein.

In the second embodiment, moreover, since the rotating force of the single crystal pulling rod 9 is not utilized as the drive source for the main driving gear 31, which is rotatably mounted on the upper tubular body 8 with the single crystal pulling rod 9 enclosed therein, vibrations which prevent the growth of the crystal will never be transmitted from the control rod drive to the rod 9. As an option, the driving force transmission means for the magnets 27 may be constructed so that pulleys mounted on the cylinders 15 are rotated simultaneously through a single endless belt entrained thereabout.

According to the second embodiment, moreover, the three cylinders 15 each enclosing the control rods 16 are disposed radially at equal intervals around the upper tubular body (cylinder) 8, and the driven gears 30 which rotate together with the outside magnets 27 disposed outside the three cylinders 15 are rotated simultaneously by means of the main driving gear 31 mounted on the upper tubular body 8. Consequently, the baffle plate positioning and locating apparatus can be mounted efficiently in a limited narrow space.

During the single crystal pulling operation, the spacing between the upper surface of the baffle plate 6 (14) and the surface of the feed melt "a" may be maintained at a constant spacing by holding the control rod 12 or rods 16 in a predetermined position while moving the crucible 5 as the crystal growing operation proceeds. This is also included in the technical scope of the present invention since the control rod 12 or rods 16 may be initially moved vertically to obtain the correct predetermined position and thereafter the crucible may be vertically moved to maintain the correct predetermined position relative to the surface of the feed melt. Or both the control rods 12 (16) and the crucible may be moved vertically according to any desired pattern or plan to achieve the desired result.

What is claimed is:

1. A baffle plate positioning and locating apparatus for use in pulling a single crystal from a feed melt maintained in an inert gas atmosphere of a high pressure while maintaining a baffle plate in a predetermined position below the surface of the feed melt, comprising a plurality of cylinders each of a hermetically sealed structure adapted to be hermetically sealed to a furnace in which a crystal growing operation is taking place by pulling a crystal from a feed melt contained in a crucible, a control rod contained within each of said cylinders and adapted to project into said furnace to enter into the crucible to maintain the baffle plate in the predetermined position under the surface of the feed melt in the crucible, said control rods being disposed in a spatial relationship with a single crystal pulling rod disposed between them, and a drive means for vertically moving said control rods simultaneously to cause same to enter and withdraw from the crucible at the same rate and to assume controllable positions within the crucible, said drive means comprising outside magnets of magnetic drive mechanisms which have inside magnet counter parts disposed in said cylinders, for driving said control rods vertically, and means for rotating said outside magnets simultaneously to simultaneously drive said inside magnet counter parts and said control rods.

2. A baffle plate positioning and locating apparatus for use in pulling a single crystal from a feed melt contained in a crucible and maintained in an inert gas atmosphere of a high pressure while maintaining a baffle plate in a predetermined position below the surface of the feed melt, said baffle plate positioning and locating apparatus comprising:
- a plurality of control rods for maintaining said baffle plate in the predetermined position, said control rods being disposed about or radially around an upper tubular body enclosing therein a single crystal pulling-up rod;
- cylinders having hermetically sealed structures and enclosing therein said control rods;
- a main driving gear rotatably mounted on said upper tubular body; and
- magnetic drive mechanisms each having magnets disposed inside and outside respective ones of each of said cylinders;
- wherein said main driving gear is engaged with a driven gear mounted on each outside magnet of said magnetic drive mechanisms, said outside magnets are rotated simultaneously through said main driving gear, and said control rods are moved simultaneously in vertical directions through said inside magnets which are rotated simultaneously by magnetic forces of said outside magnets.

3. A baffle plate positioning and locating apparatus according to claim 1, wherein a hermetically sealed tubular body encloses said single crystal pulling rod, said hermetically sealed cylinders being disposed about or radially around said tubular body, and wherein said drive means further comprises a gear fixedly mounted on each of said outside magnets of said magnetic drive mechanisms and a common drive gear mounted rotatably on said tubular body for rotating said gears and said outside magnets in common to simultaneously drive said inside magnet counter parts and said control rods.

4. A baffle plate positioning and locating apparatus according to claim 1, wherein the axial movement of said control rods by said magnetic drive mechanisms is effected through engagement of internal thread portions formed on the inside magnet counter parts rotatably enclosed in said cylinders with external thread portions formed on said control rods and wherein sliding key mechanisms are provided to prevent said control rods from rotating.

5. A baffle plate positioning and locating apparatus according to claim 1, wherein said control rods are fixed to said baffle plate.

6. A baffle plate positioning and locating apparatus according to claim 1, wherein said control rods merely abut with the upper surface of said baffle plate.

7. A baffle plate positioning and locating apparatus according to claim 2, wherein each of said control rods is made of boron nitride (BN).

8. A baffle plate positioning and locating apparatus according to claim 1, wherein said control rods are made of boron nitride (BN).

9. A baffle plate positioning and locating apparatus according to claim 2, wherein said control rods merely abut with the upper surface of said baffle plate.

10. A baffle plate positioning and locating apparatus according to claim 2, wherein said vertical movement of said control rods by said magnetic drive mechanisms is effected through engagement of internal thread portions formed on the inside magnets enclosed in said cylinders with external thread portions formed on said control rods and wherein sliding key mechanisms are provided to prevent said control rods from rotating.

11. A baffle plate positioning and locating apparatus according to claim 2, wherein said control rods are fixed to said baffle plate.

* * * * *